(12) United States Patent
Li et al.

(10) Patent No.: US 8,525,260 B2
(45) Date of Patent: Sep. 3, 2013

(54) SUPER JUNCTION DEVICE WITH DEEP TRENCH AND IMPLANT

(75) Inventors: Tiesheng Li, San Jose, CA (US); Michael R. Hsing, Saratoga, CA (US); Deming Xiao, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 282 days.

(21) Appl. No.: 12/728,044

(22) Filed: Mar. 19, 2010

(65) Prior Publication Data

US 2011/0227147 A1 Sep. 22, 2011

(51) Int. Cl.
*H01L 21/00* (2006.01)

(52) U.S. Cl.
USPC ............. 257/341; 257/328; 257/329

(58) Field of Classification Search
USPC ........................ 257/341, 328, 329
See application file for complete search history.

(56) References Cited

U.S. PATENT DOCUMENTS

| | | | | |
|---|---|---|---|---|
| 5,430,315 A * | 7/1995 | Rumennik | ............ | 257/331 |
| 5,661,322 A * | 8/1997 | Williams et al. | ............ | 257/331 |
| 5,998,836 A * | 12/1999 | Williams | ............ | 257/341 |
| 5,998,837 A * | 12/1999 | Williams | ............ | 257/341 |
| 6,049,108 A * | 4/2000 | Williams et al. | ............ | 257/341 |
| 6,118,149 A * | 9/2000 | Nakagawa et al. | ............ | 257/330 |
| 6,140,678 A * | 10/2000 | Grabowski et al. | ............ | 257/328 |
| 6,740,931 B2 * | 5/2004 | Kouzuki et al. | ............ | 257/341 |
| 6,821,824 B2 * | 11/2004 | Minato et al. | ............ | 438/138 |
| 6,991,977 B2 * | 1/2006 | Kocon | ............ | 438/206 |
| 7,105,387 B2 * | 9/2006 | Minato et al. | ............ | 438/138 |
| 7,161,209 B2 * | 1/2007 | Saito et al. | ............ | 257/341 |
| 7,224,022 B2 * | 5/2007 | Tokano et al. | ............ | 257/328 |
| 7,301,203 B2 * | 11/2007 | Lee et al. | ............ | 257/339 |
| 7,317,225 B2 * | 1/2008 | Saito et al. | ............ | 257/341 |
| 7,345,342 B2 * | 3/2008 | Challa et al. | ............ | 257/341 |
| 7,368,777 B2 * | 5/2008 | Kocon | ............ | 257/302 |
| 7,396,732 B2 * | 7/2008 | Kunnen | ............ | 438/322 |
| 7,400,024 B2 * | 7/2008 | Kunnen | ............ | 257/511 |
| 7,465,990 B2 * | 12/2008 | Yamauchi et al. | ............ | 257/341 |
| 7,655,981 B2 * | 2/2010 | Lee et al. | ............ | 257/339 |
| 7,670,908 B2 * | 3/2010 | Hebert et al. | ............ | 438/259 |
| 7,871,882 B2 * | 1/2011 | Parthasarathy et al. | ............ | 438/235 |
| 7,977,740 B2 * | 7/2011 | Hebert | ............ | 257/330 |
| 8,067,800 B2 * | 11/2011 | Hsieh | ............ | 257/331 |
| 8,084,811 B2 * | 12/2011 | Disney et al. | ............ | 257/329 |
| 8,399,907 B2 * | 3/2013 | Parthasarathy et al. | ............ | 257/133 |
| 8,410,548 B2 * | 4/2013 | Parthasarathy et al. | ............ | 257/330 |
| 2004/0012038 A1 * | 1/2004 | Kouzuki et al. | ............ | 257/200 |
| 2004/0238844 A1 * | 12/2004 | Tokano et al. | ............ | 257/197 |
| 2005/0280086 A1 * | 12/2005 | Saito et al. | ............ | 257/341 |
| 2006/0131655 A1 * | 6/2006 | Kunnen | ............ | 257/369 |
| 2006/0208334 A1 * | 9/2006 | Yamauchi et al. | ............ | 257/491 |
| 2006/0258077 A1 * | 11/2006 | Kunnen | ............ | 438/202 |
| 2007/0040217 A1 * | 2/2007 | Saito et al. | ............ | 257/341 |
| 2007/0228496 A1 * | 10/2007 | Rochefort et al. | ............ | 257/409 |
| 2008/0173969 A1 * | 7/2008 | Hebert et al. | ............ | 257/488 |
| 2010/0052046 A1 * | 3/2010 | Wang et al. | ............ | 257/329 |
| 2010/0155878 A1 * | 6/2010 | Hebert et al. | ............ | 257/487 |
| 2011/0006304 A1 * | 1/2011 | Xiao et al. | ............ | 257/49 |

(Continued)

*Primary Examiner* — Laura Menz

(74) *Attorney, Agent, or Firm* — Perkins Coie LLP

(57) ABSTRACT

RESURF effect devices with both relatively deep trenches and relatively deep implants are described herein. Also, methods of fabricating such devices are described herein. A RESURF effect device may include alternating regions of first and second conductivity types where each of the second regions includes an implant region formed into a trench region of the second region.

13 Claims, 6 Drawing Sheets

(56) References Cited

U.S. PATENT DOCUMENTS

| | | | |
|---|---|---|---|
| 2011/0084333 A1* | 4/2011 | Disney et al. | 257/330 |
| 2011/0127606 A1* | 6/2011 | Bobde et al. | 257/337 |
| 2011/0147830 A1* | 6/2011 | Chen et al. | 257/330 |
| 2011/0156139 A1* | 6/2011 | Hsieh | 257/331 |
| 2011/0201174 A1* | 8/2011 | Hebert et al. | 438/434 |
| 2011/0227147 A1* | 9/2011 | Li et al. | 257/329 |
| 2011/0241111 A1* | 10/2011 | Tamaki et al. | 257/342 |
| 2011/0278650 A1* | 11/2011 | Tamaki et al. | 257/288 |
| 2011/0309442 A1* | 12/2011 | Grote et al. | 257/339 |
| 2012/0058607 A1* | 3/2012 | Parthasarathy et al. | 438/138 |
| 2012/0061720 A1* | 3/2012 | Parthasarathy et al. | 257/133 |
| 2012/0061722 A1* | 3/2012 | Hashimoto et al. | 257/133 |
| 2012/0061754 A1* | 3/2012 | Hsieh | 257/331 |
| 2012/0064684 A1* | 3/2012 | Hsieh | 438/270 |
| 2012/0313140 A1* | 12/2012 | Parthasarathy et al. | 257/139 |

\* cited by examiner

SUPER JUNCTION DEVICE WITH DEEP TRENCH AND IMPLANT

TECHNICAL FIELD

The present invention relates to semiconductor devices and processes, for example, to super junction devices having relatively deep trenches and relatively deep implants.

BACKGROUND

In high voltage metal-oxide-semiconductor field-effect transistor (MOSFET) devices, high breakdown voltage (BV) and low on-resistance ($R_{ON}$) are generally desirable characteristics. However, both of these characteristics typically depend on the thickness and resistance of a device's drift region. Typically, both of these characteristics increase as the dopant concentration decreases or the thickness increases. In order to lower $R_{ON}$ while maintaining BV, Reduced Surface Field (RESURF) technology may be employed. For example, RESURF devices may operate with a reduced maximum electric field within the drift region due to use of multiple depletion regions between the drift and source regions.

Super junction device 100 of FIG. 1 is one example of a RESURF device. As shown, device 100 includes N+ region 10, drift region 11, P source regions 12, N+ source regions 13, and gates 14. In device 100, drift region 11 includes a super junction structure including N stripes 111 alternated with P stripes 112. The alternation of N stripes 111 with P stripes 112 may enable lateral depletion while allowing doping concentration of drift region 11 to be relatively great (e.g., for a relatively low $R_{ON}$) for a given BV. However, fabrication of super junction device 100 may be relatively difficult. For example, it may be difficult to accurately fabricate stripes in drift region 11.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative size depicted.

For a better understanding of the present invention, reference will be made to the following Detailed Description, which is to be read in association with the accompanying drawings, wherein.

DETAILED DESCRIPTION

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section. Likewise, terms used to describe a position or location, such as "under," "below," "over," "above," "right," "left," and similar, are used relative to the orientation of the illustrated embodiments and are intended to encompass similar structures when rotated into the illustrated orientation. The term "semiconductor substrate" includes individual integrated circuit dies, sensor dies, switch dies, dies having other semiconductor features, and/or the like. The term "photoresist" may refer to materials that can be chemically modified when exposed to radiation of a suitable type. "Photoresist" may also refer to either positive photoresist or negative photoresist. The term "based on" or "based upon" is not exclusive and is equivalent to the term "based, at least in part, on" and includes being based on additional factors, some of which are not described herein. References in the singular are made merely for clarity of reading and include plural references unless plural references are specifically excluded. The term "or" is an inclusive "or" operator and is equivalent to the term "and/or" unless specifically indicated otherwise. In the description that follows, the scope of the term "some embodiments" is not to be so limited as to mean more than one embodiment, but rather, the scope may include one embodiment, more than one embodiment, or all embodiments. Although illustrated with respect to vertical MOSFET devices, the technology described herein is also applicable to other power devices, planer gate devices, lateral power devices, N-channel devices, P-channel devices, lateral semiconductor devices, insulated gate bi-polar transistors, diodes, bipolar junction transistors, enhancement mode devices, depletion mode devices, and/or the like. Likewise, the technology described herein is applicable to devices with either N-type substrate materials and/or P-type substrate materials.

Figure 1:
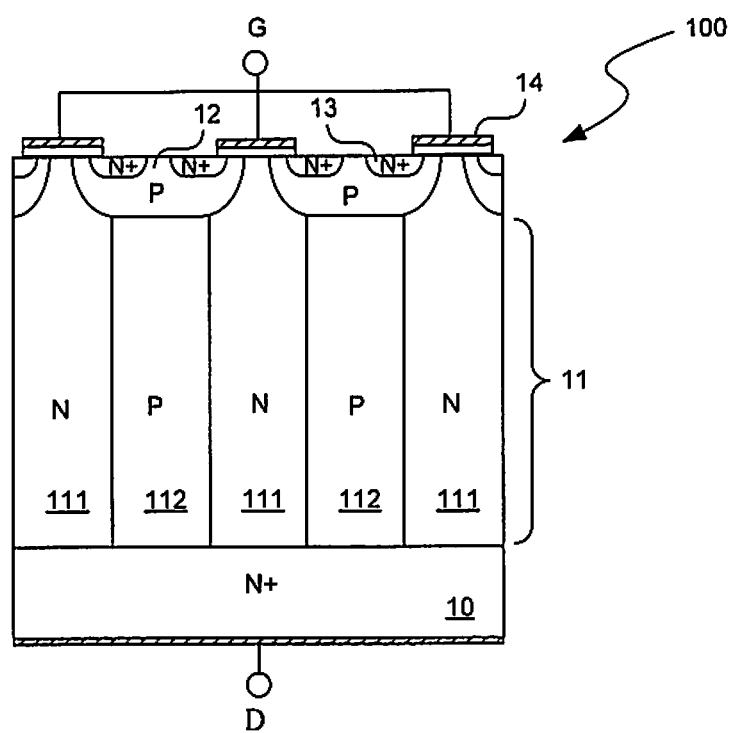
FIG. 1 is a cross-sectional view of a super junction device.
Figure 2:
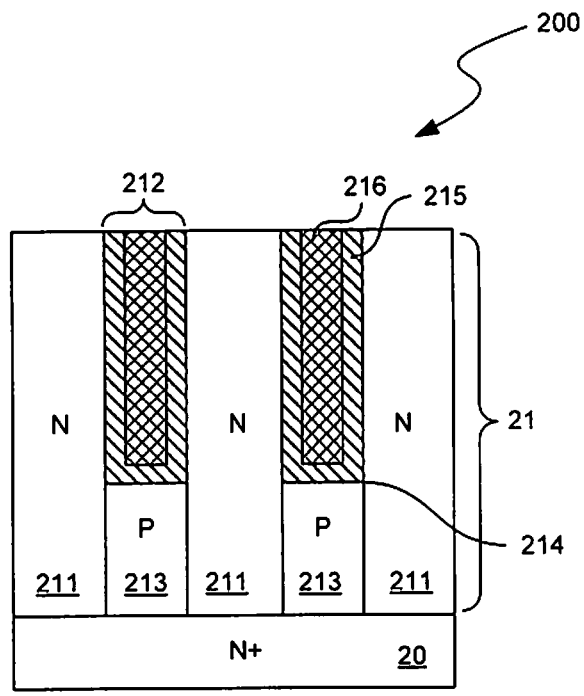
FIG. 2 illustrates a super junction device according to embodiments of the present invention.

FIG. 2 illustrates super junction device 200. Super junction device 200 includes N+ substrate 20 and drift region 21. Drift region 21 includes alternating N regions 211 and P regions 212 (e.g., each of N regions 211 is separated from each of the others by one of P regions 212, and each of P regions 212 is separated from each of the others by one of N regions 211). Each of P regions 212 may also include an implant region 213, between N+ substrate 20 and a corresponding trench region 214, that is formed via a high energy ion implementation process. Each of trench regions 214 may include a corresponding insulation layer 215 that encapsulates the P-type material forming each of P columns 216. As illustrated in FIG. 2, each P column 216 is separated from the corresponding N regions 211 and implant region 213 by insulation layer 215. Thus, insulation layers 215 may have lateral contact with N regions 211 and be above implant regions 213.

N regions 211, implant regions 213, and P columns 216 may also be formed of any suitable materials and be doped with ion concentrations suitable to enable lateral depletion. For example, P columns 216 may include doped polysilicon and/or any other suitable materials, and insulation layer 215 may include dielectric material such as silicon dioxide, silicon nitride, and/or any other suitable material. In one embodiment, the inclusion of both implant regions 213 and trench regions 214 in P regions 212 enhances RESURF effects at or near the lower portion of drift region 21.

Figure 3:
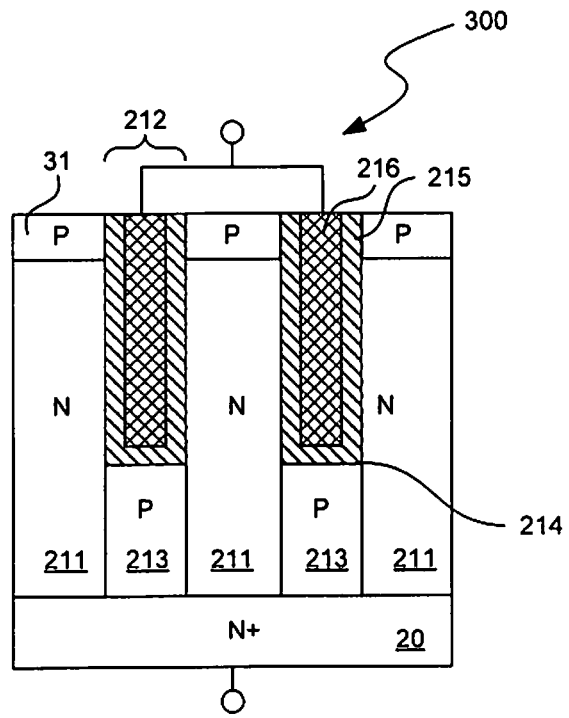
FIG. 3 illustrates another super junction device according to embodiments of the present invention.

FIG. 3 illustrates super junction device 300. In addition to the features of super junction device 200, each of N regions 211 of super junction device 300 is capped with one of P regions 31. Further, P columns 216 are electrically coupled together as a source. In one embodiment, P columns 216 may also be shorted to and/or otherwise electrically coupled to P regions 31. In yet another embodiment, P regions 31 may also extend laterally over P columns 216 (not illustrated).

Figure 4A:
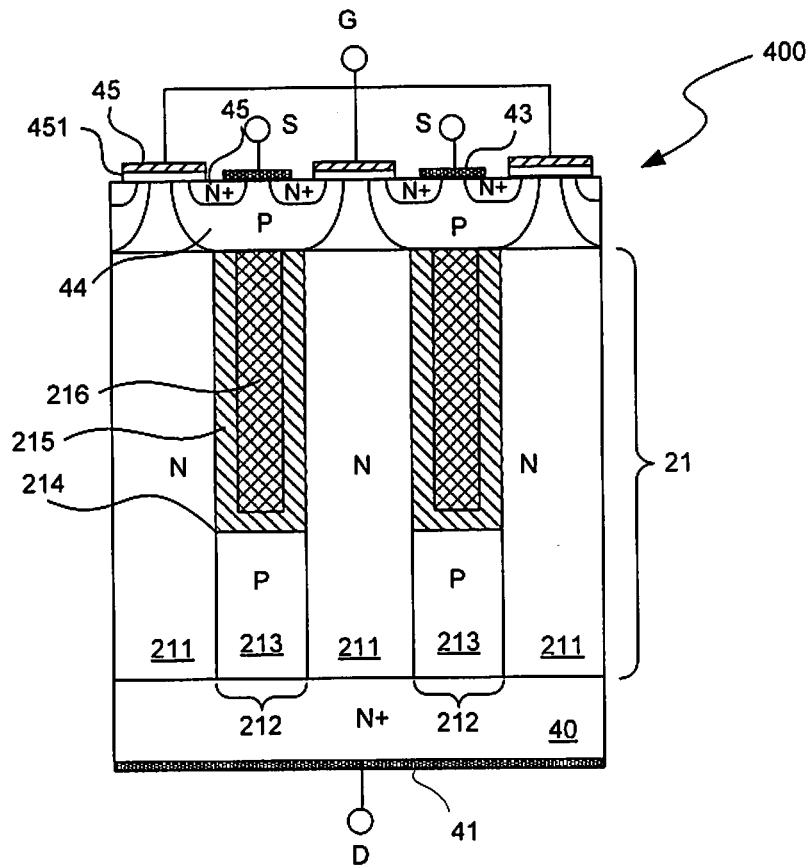
FIGS. 4A-4B illustrate a vertical MOSFET according to embodiments of the present invention.
Figure 4B:
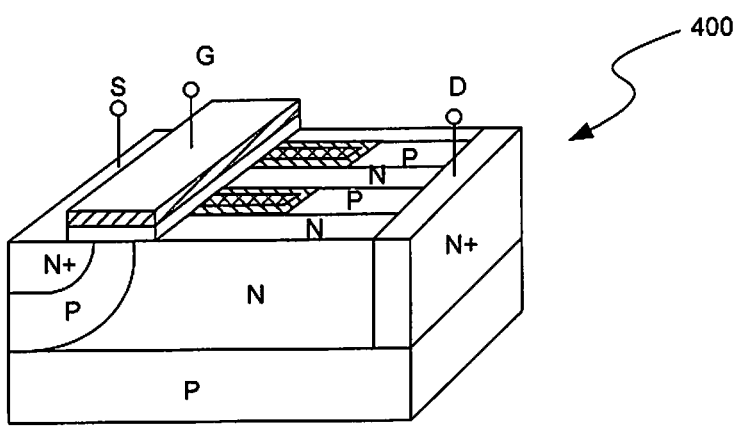

FIG. 4A is a cross-sectional view illustrating vertical MOSFET 400. FIG. 4B is a perspective view illustrating MOSFET 400. As illustrated in FIGS. 4A-4B, MOSFET 400 includes drain electrode 41 coupled to and/or formed on N-type drain region 40 of an N+ substrate. As one example, N-type drain region 40 may have a resistivity of about 0.001 ohm-cm to 0.1 ohm-cm. However, other drain regions may have any other suitable resistivities. In one embodiment, N regions 211 may also include upper layers and lower layers. In one such embodiment, the upper layers may have lower dopant concentrations than the lower layers. Further, the upper layer may have a thickness in the range of about 1 micron to 100 microns and a doping concentration in the range of about $1*10^{14}$ cm$^{-3}$ to $5*10^{16}$ cm$^{-3}$, and the lower layer may have a thickness in the range of about 1 micron to 10 microns and a doping concentration in the range of about $5*10^{17}$ cm$^{-3}$ to $5*10^{20}$ cm$^{-3}$.

Similar to super junction device 200, MOSFET 400 may include N+ substrate 20 and drift region 21 as discussed above. However, MOSFET 400 may further include MOSFET features such as N+ source regions 43, source electrodes 431, P-type body regions 44, gates 45, and gate oxide regions 451. As shown, each of source electrodes 431 is coupled to one or more of N+ source regions 43 and/or P-type body regions 44. Further, each of N+ source regions 43 and P-type body regions 44 may be disposed over one of P regions 212. Gates 45 may also be formed on gate oxide regions 451 and spaced apart from source electrodes 431.

FIGS. 5A-5F illustrate a method of fabricating super junction device 200 of FIG. 2.

Figure 5A:
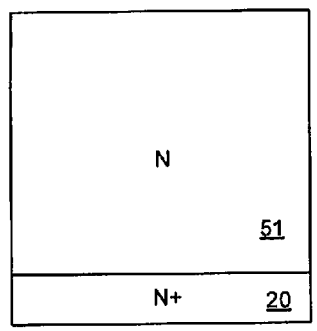
FIGS. 5A-5F illustrate a method of fabricating the super junction device of FIG. 2 according to embodiments of the present invention.

As shown in FIG. 5A, N-type epitaxial layer 51 is formed on N+ substrate 20. For example, N-type epitaxial layer 51 may be grown via a chemical vapor deposition (CVD) process, a plasma enhanced chemical vapor deposition (PECVD) process, an atomic layer deposition (ALD) process, a liquid phase epitaxy process, and/or any other suitable process. As one example, N-type epitaxial layer 51 may include a monocrystalline silicon film or layer formed on a monocrystalline substrate and may be doped with phosphorus, arsenic, antimony, and/or any other suitable dopant. However, any other suitable semiconductor material may be employed.

Figure 5B:
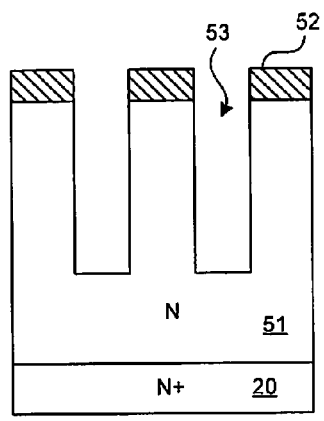

After formation of N-type epitaxial layer 51, relatively deep trenches 53 may be formed as illustrated by FIG. 5B. Formation of trenches 53 may include, for example, forming mask 52 on N-type epitaxial layer 51, e.g. through a growth or deposition process. Photoresist may then be deposited on N-type epitaxial layer 51, and an etching process may be employed to pattern mask 52. However, in another embodiment, photoresist may be employed as mask 52 instead of being employed to pattern mask 52. Following patterning of mask 52, the photoresist may be removed and N-type epitaxial layer 51 anisotropically etched to form trenches 53. In one embodiment, etching of N-type epitaxial layer 51 may include a reactive ion etching (RIE) process. The etching process may also be performed to etch trenches of any suitable depth and/or width. As shown, trenches 53 are etched such that they do not reach N+ substrate 20. Although two trenches are shown in FIG. 5B, any suitable number of trenches may be formed.

Figure 5C:
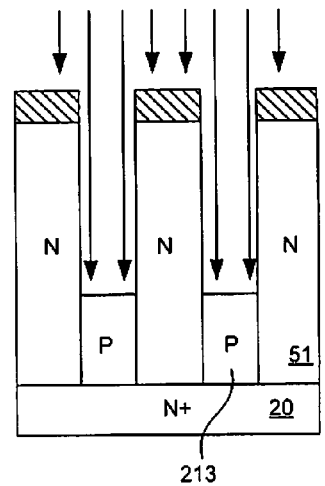

As shown in FIG. 5C, P-type ions may then be implanted through trenches 53 into N-type epitaxial layer 51 to form implant regions 213. In one embodiment, boron ions may be implanted through a high-energy implantation process with a dose in the range of $5*10^{11}$ cm$^{-3}$ to $5*10^{12}$ cm$^{-3}$, and with an energy in the range of 200 keV to 25 MeV However, any suitable doses and/or energies may be employed. In one example, ions may be implanted into N-type epitaxial layer 51 in a vertical orientation through trenches 53 to reach and/or enter N+ substrate 20. Further, by continuously changing implantation energy and/or ion dose, ions may be selectively infused at different depths of N-type epitaxial layer 51 to obtain uniform impurity concentration profiles for implant regions 213. In one embodiment, a heat treatment process (e.g., annealing) may be performed after implantation.

Figure 5D:
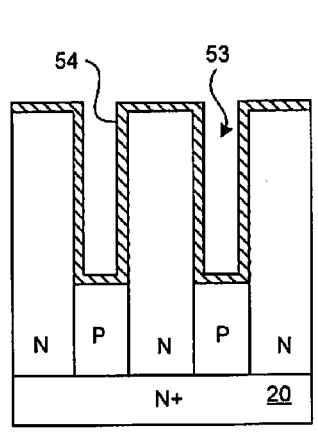

Insulation layer 54 may then be formed on the inside surface of the trenches 53 as illustrated by FIG. 5D. As one example, insulation layer 54 may have a thickness of about 1,000 to 1,500 angstroms and be chemical vapor deposition (CVD) formed silicon dioxide. However, any other suitable thicknesses or processes (e.g., thermal oxidation or other suitable process) may be employed. Insulation layer 54 may also include spin-on glass, flowable oxide, organic materials, other suitable materials having a relatively low rate of dopant diffusion, and/or the like.

Figure 5E:
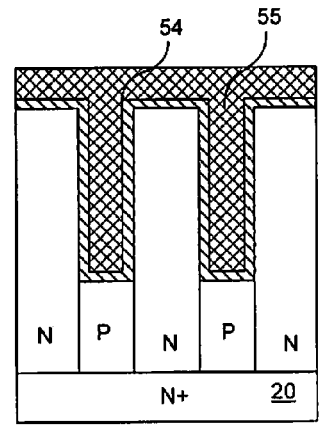
Figure 5F:
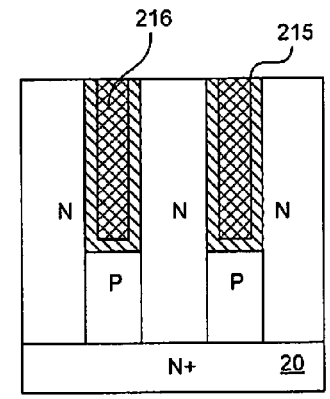

After forming insulation layer 54, polysilicon 55 may be deposited onto the surface of insulation layer 54 and into trenches 53 as shown in FIG. 5E. As another example, other P-type materials instead of polysilicon 55 may be deposited. As shown in FIG. 5F, polysilicon 55 and insulation layer 54 may then be mechanically or chemically removed to result in device 200.

Figure 6:
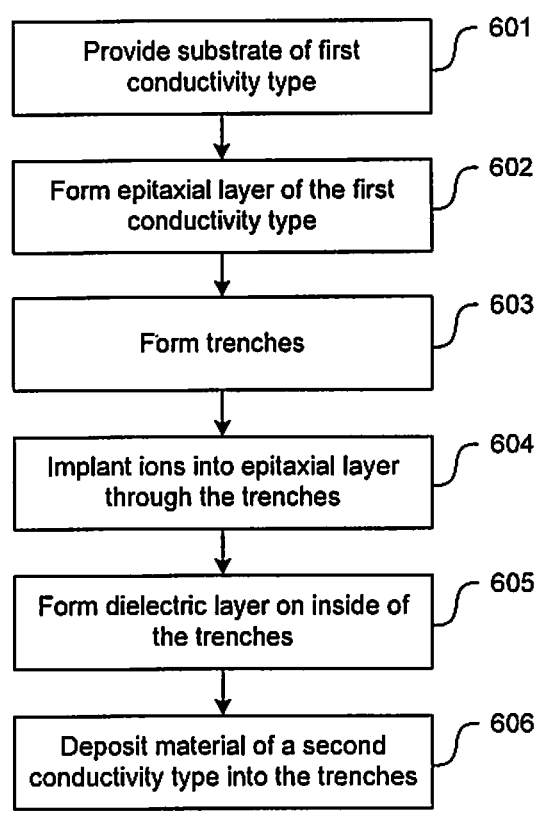
FIG. 6 illustrates another method of fabricating a super junction device according to embodiments of the present invention.

FIG. 6 illustrates another method of fabricating a super junction device according to embodiments of the present invention. At step 601, a substrate with a first conductivity type is provided. In one embodiment, the provided substrate may have a uniform dopant concentration. However, the substrate of other embodiments may have different dopant concentrations along any or all orientations. Next, at step 602, an epitaxial layer of the first conductivity type is formed (e.g., grown) on the substrate. The epitaxial layer may have a lighter dopant concentration than that of the substrate. However, epitaxial layers of any suitable dopant concentrations may be employed. At step 603, trenches are then formed into the epitaxial layer to form columns separated from each other. In one embodiment, the trenches are formed by depositing photoresist onto the epitaxial layer, patterning the photoresist, and etching the epitaxial layer through the patterned photoresist. The etching may be performed such that the trenches do not penetrate the epitaxial layer. At step 604, ions of a second conductivity type are then vertically implanted into the epitaxial layer through the trenches. As one example, the ion may be implanted down to and/or into the substrate. Further, the thickness of the epitaxial layer may be the sum of the etching depth and the implant depth where the implant depth is based on etching and ion acceleration process characteristics. In step 605, insulation material may then be formed on inside surfaces of the trenches before material of a second conductivity type is deposited into the trenches at step 606. Mechanical and/or chemical polishing may also be performed to flatten a surface of the device.

Although the technology discussed with respect to FIGS. 5 and 6 includes certain processes and/or features, other variations are possible. For example, trenches may be etched into a semiconductor substrate without first forming an epitaxial layer. In such embodiments, the substrate may include a monocrystalline silicon or other suitable semiconductor material doped with one or more dopants. In yet other embodiments, other features may be fabricated onto the device.

Figure 7:
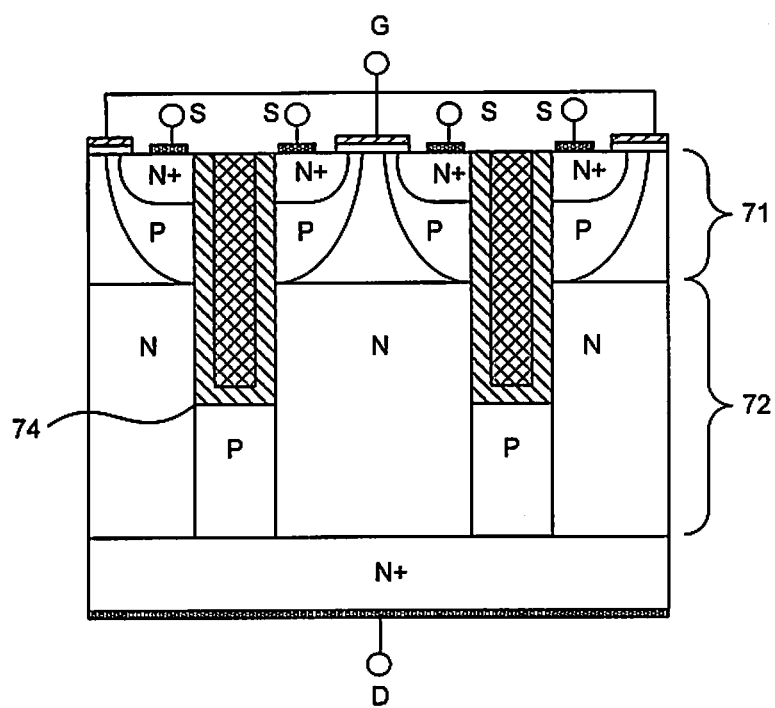
FIG. 7 illustrates another vertical MOSFET according to embodiments of the present invention.

FIG. 7 illustrates another vertical MOSFET super junction device according to embodiments of the present invention;

In the embodiment shown in FIG. 7, trench regions 74 are formed in a semiconductor material that includes active layer 71 and epitaxial layer 72. As shown, trench regions 74 extend through active layer 71 as well as into epitaxial layer 72.

In the illustrated configuration, the depth of P region 212 substantially equals the sum of the depths of implant region 213 and trench region 214, thus making P region 212 deeper than generally obtained with only etching.

While the above Detailed Description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description explicitly defines such terms. Accordingly, the actual scope of the invention encompasses not only the disclosed embodiments, but also all equivalent ways of practicing or implementing the invention under the claims.

We claim:

1. A device, comprising:
   a substrate;
   a plurality of first regions of a first conductivity type formed on the substrate; and
   a plurality of second regions of a second conductivity type formed on the substrate and interleaved with the plurality of first regions, wherein each of the second regions includes:
   an implant region implanted between the substrate and a trenched region;
   a conductive column of the second conductivity type formed into the trenched region; and
   an insulative barrier configured to insulate the conductive column from the implant region and from the first regions adjacent to the second region.

2. The device of claim 1, wherein the substrate is an N+ substrate, the first regions are N regions, and the second regions are P regions.

3. The device of claim 1, wherein first conductivity type is N-type and the second conductivity type is P-type.

4. The device of claim 1, wherein the conductive column includes doped polysilicon.

5. The device of claim 1, wherein each of the first regions is formed as a column and is vertically disposed between the substrate and a third region of the second conductivity type.

6. The device of claim 5, wherein each of the first regions are electrically shorted to respective third regions.

7. The device of claim 1, wherein the substrate includes at least two layers, and wherein dopant concentrations of each of the two layers are different.

8. The device of claim 1, wherein the insulation barriers include silicon dioxide.

9. The device of claim 1, wherein the insulation barriers include spin-on glass, a flowable oxide, or an organic material.

10. The device of claim 1, wherein the trench regions extends into an active layer of the device.

11. The device of claim 1, wherein the device is a metal-oxide-semiconductor field-effect transistor.

12. The device of claim 1, wherein the plurality of first regions and the plurality of second regions form a drift region of a semiconductor device.

13. The device of claim 1, wherein the device is a metal-oxide-semiconductor field-effect transistor, and wherein the device further comprises:
   drain regions of the first conductivity type;
   source regions; and
   gate regions.

* * * * *